US006617862B1

United States Patent
Bruce

(10) Patent No.: US 6,617,862 B1
(45) Date of Patent: Sep. 9, 2003

(54) LASER INTRUSIVE TECHNIQUE FOR LOCATING SPECIFIC INTEGRATED CIRCUIT CURRENT PATHS

(75) Inventor: Victoria J. Bruce, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/084,100

(22) Filed: Feb. 27, 2002

(51) Int. Cl.[7] .................... G01R 31/28; G01R 31/302
(52) U.S. Cl. .............................. 324/752; 324/765
(58) Field of Search .............................. 324/750, 751, 324/752, 501, 765

(56) References Cited

U.S. PATENT DOCUMENTS

| 5,404,099 A | * | 4/1995 | Sahara ...................... 324/158.1 |
| 5,430,305 A | | 7/1995 | Cole, Jr. et al. ........ 250/559.07 |
| 5,804,980 A | * | 9/1998 | Nikawa ...................... 324/752 |
| 5,844,416 A | | 12/1998 | Campbell et al. ........... 324/750 |
| 6,028,435 A | * | 2/2000 | Nikawa ...................... 324/752 |
| 6,043,672 A | * | 3/2000 | Sugasawara ................ 324/765 |
| 6,078,183 A | | 6/2000 | Cole, Jr. ...................... 324/752 |
| 6,107,817 A | * | 8/2000 | Kalb, Jr. ...................... 324/765 |

* cited by examiner

Primary Examiner—Ernest Karlsen
(74) Attorney, Agent, or Firm—Meyertons, Hood, Kivlin, Kowert, & Goetzel, P.C.; B. Noël Kivlin

(57) ABSTRACT

A method and apparatus for locating integrated circuit defects associated with different aspects of the integrated circuit industry. The integrated circuit is configured in a known failing mode, with a first power supply providing a constant voltage and variable current. Next, one or more additional dedicated power supplies are connected to various points of interest throughout the integrated circuit, wherein these dedicated power supplies have a preset current and the voltage is allowed to vary. The integrated circuit is then scanned with a laser beam, which induces current changes on in the integrated circuit especially in defective areas. These current changes then cause voltage changes on the dedicated power supplies. When such a voltage change occurs on the dedicated power supplies, its position is noted.

18 Claims, 4 Drawing Sheets

LASER INTRUSIVE TECHNIQUE FOR LOCATING SPECIFIC INTEGRATED CIRCUIT CURRENT PATHS

BACKGROUND

1. Field of the Invention

The present invention relates generally to failure analysis and device qualification in integrated circuits, as well as design debugging. More particularly, the present invention relates to an improved method of locating specific integrated circuit current paths that are related to defects, misprocessing or poor circuit design.

2. Description of Related Art

In integrated circuit ("IC") manufacturing, parts are tested throughout various stages of fabrication and packaging. Some parts may not pass the required tests or may otherwise be deemed defective. For example, if an input/output pin on the IC has a current leakage path it may be deemed defective. Many times in developing and manufacturing ICs it is difficult to determine exactly what causes the defective part to fail the required tests. IC technology trends only exacerbate this problem as more routing layers are required to connect tightly packed circuit elements. In addition, the number of transistors in each successive generation of ICs are doubling approximately every eighteen months, which results in a continual increase in total current demand with each new generation of ICs. Methods for determining the root cause of the defective ICs are a vital part of developing and manufacturing integrated circuits.

Fortunately, IC analysis apparatuses and methods exist which provide useful insight into design, manufacturing, and processing defects, as well as other failure modes. IC analysis includes the location, identification, and mapping of an IC to reveal defects. For example, different methods for IC analysis are described in, "Novel Failure Analysis Techniques Using Photon Probing With a Scanning Optical Microscope," by E. I. Cole Jr. et al. Of particular interest is the Light-Induced Voltage Alteration ("LIVA") method.

In addition, U.S. Pat. Nos. 5,430,305 and 6,078,183 disclose LIVA and Thermally-Induced Voltage Alteration ("TIVA") techniques for ICs respectively. These techniques power the entire IC with a constant current source (the voltage supplied to the IC may vary) while scanning the surface of the IC with a light source of specific wavelengths that depend on whether LIVA or TIVA is used. Localized current changes are induced due to photon exposure (LIVA), or localized heating of the IC (TIVA). These local current changes alter the total power required, and these changes are more pronounced when the light source is exposed to a defect on the IC. Since the IC is powered by a power supply with constant current and variable voltage, any alteration in the total power requirement causes a voltage alteration on the power supply. Therefore a voltage alteration on the power supply caused by light exposure may indicate that a defect in the area of the IC that is being exposed to the light source.

However, these methods have weaknesses that cause defects to be overlooked. For example, in a typical setup, the IC is tested with various capacitors connected to the power supply to filter out noise injection from the power supply. Besides filtering noise, the capacitors attenuate the induced voltage alteration, thereby allowing defects to remain unnoticed. Another problem is that circuit elements that are only marginally defective may not produce enough of a current change when exposed to the light source to overcome the noise floor and be noticed. With millions of circuit elements (specifically transistors) in a typical IC, the overall noise floor can be quite high. This remains true despite the fact that each transistor may be in a quiescent state and will draw only a minute amount of current individually. In such circumstances, a marginally defective transistor that produces less of a current change than a fully defective transistor with respect to the overall quiescent current draw is more likely to remain unnoticed. In addition, because current demands (both quiescent and dynamic) in successive generations of ICs increase every eighteen months, the current risk becoming less and less capable of detecting defects. Accordingly, a solution to these problems is needed.

BRIEF SUMMARY OF THE PREFERRED EMBODIMENTS OF THE INVENTION

The present invention provides an improved defect detection technique and system. In a preferred embodiment, the defect detection system includes two separate power supplies: a global power supply and a dedicated power supply. The global power supply provides power to the IC and is preferably a constant voltage power supply. The dedicated power supply supplies power to specific points of interest on the IC, and may be a variable current and/or a variable voltage power supply. The dedicated power supply may be configured to supply a constant current approximately equal to a previously measured value while letting the voltage vary. Next the IC is scanned with the light source, and the defect causes a change in power demand on the dedicated power supply when exposed to the light source. This change in power demand is the result of photon exposure or localized heating of the IC, and is more of a drastic change when the light is exposed to a defect on the IC. The change in power demand causes a voltage alteration on the dedicated power supply, thereby allowing a defect to be spotted.

The present invention is expected to alleviate the problems described above because the global power supply provides the quiescent current to the IC. The separate dedicated power supply then has a lower noise floor and is more sensitive to voltage alterations, especially from marginally defective devices. Therefore, a voltage alteration on the dedicated power supply is measured independent of any background noise resulting from the quiescent state of the IC. Also, if the dedicated power supply supplies power only the suspect area of the IC, then a greater sensitivity is achieved when the laser is scanned over that area. This same premise is expected to provide promising results even as new generations of ICs are developed which require more current.

BRIEF DESCRIPTION OF THE DRAWINGS

A better understanding of the present invention can be obtained when the following detailed description of the preferred embodiments is considered in conjunction with the following drawings, in which.

Figure 1:
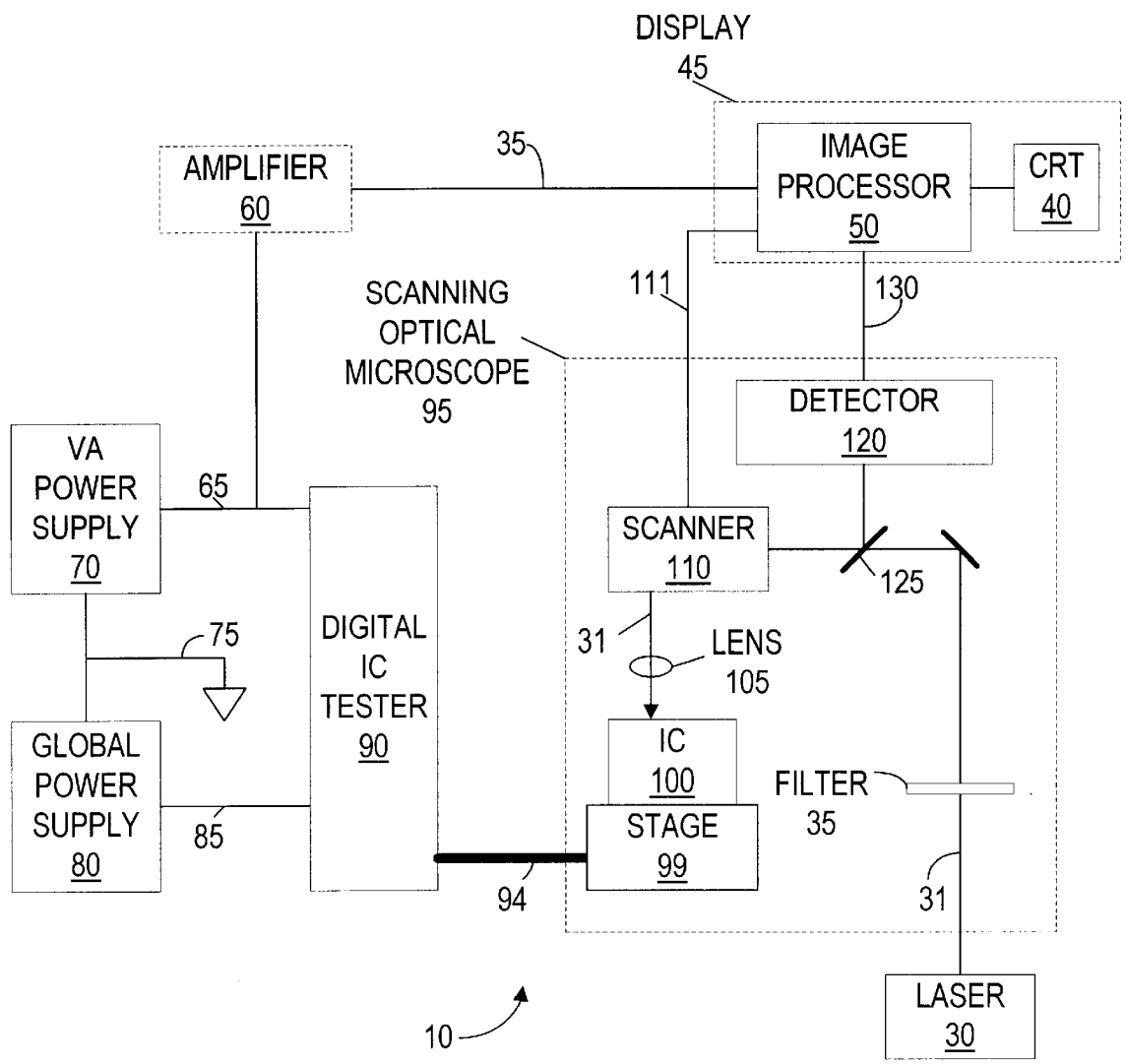
FIG. 1 is a block diagram of the IC analysis apparatus in accordance with a preferred embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components. As one skilled in the art will appreciate, functionally equivalent elements may be referred to by using different names and/or acronyms. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

The term "defect" refers to a condition contained within an IC that causes the IC to fail a functional test. The causation of such a defect may result from a wide array of specific manufacturing, processing, and/or design errors (e.g. an Electro-Static-Discharge (ESD) causing irreparable damage to the IC may occur during manufacturing or a particle may cause a short circuit between different conductors during processing.)

The term "power supply" as used herein is understood to be a method of providing voltage and current to an electrical circuit. Power supplies which occupy the same physical piece of electrical equipment while still providing separate voltages and currents are considered separate power supplies.

The "frontside" of the die is a term referring to the side of the die that includes electrical devices that have been processed onto its surface through a series of lithography steps. The "backside" of the die is a term that refers to the side opposite to the frontside and generally does not contain electrical devices. Thus, a frontside analysis technique is an analysis performed using the side of the die that has been processed and now contains electrical devices, whereas a backside analysis technique uses the side of the die that has not been processed to contain devices (also known as substrate side).

The term "flip-chip" refers to a method of packaging die such that the frontside of the die faces downward and the backside faces upward when placed into the package.

The term "failure mode" refers to a mode that an IC may be placed in such that a defect (as described above) causes the IC to fail a certain functional test.

DETAILED DESCRIPTION OF PREFERRED EMBODIMENTS

As explained below, the constant current power supply may be coupled to a point of interest on the IC via a digital IC tester, or by using a microprobe. In accordance with the preferred embodiment of the invention, a laser is scanned over the IC while monitoring a constant current power supply, which has been attached to a point of interest on the IC.

Referring to FIG. 1, an apparatus for detecting IC defects 10 is shown constructed in accordance with the preferred embodiment. Apparatus 10 preferably includes a scanning optical microscope 95, a display 45, a digital IC tester 90, a dedicated power supply 70, and a global power supply 80.

Scanning optical microscope 95 (e.g. a Carl Zeiss, Inc., Model LSM 310 scanning optical microscope) preferably includes a scanner 110, a photodetector 120, a stage 99, a lens 105, a beam splitter 125, and an optical filter 35. Also, an IC 100 is preferably placed within scanning optical microscope 95 and rests on stage 99. As shown in the embodiment of FIG. 1, laser 30 is coupled to scanning optical microscope 95 and may be either internal to scanning optical microscope 95 or externally connected. Laser 30 may be a neodymium:yttrium-vanadium-oxide (Nd:YVO$_4$) laser, a neodymium:yttrium-aluminum-garnet (Nd:YAG) laser, or a solid state diode pump laser.

Laser 30 emits a laser beam that passes through filter 35. Filter 35 limits the intensity of the laser beam to a desired level. Filter 35 is preferably oriented such that incident laser beam 31 from laser 30 passes through it before arriving at light scanner 110. The laser beam 31 passes through a beam splitter 125 and into scanner 110. Scanner 110 directs the laser beam 31 through lens 105 and onto IC 100. Light reflecting from the IC 100 passes back through lens 105 to the scanner 110 as a reflection beam. The scanner 110 directs the reflection beam back to the beam splitter 125, which in turn directs the reflection beam to detector 120. Beam splitter 125 may include mirrors of varying transmission/reflection capabilities.

Lens 105 is preferably positioned so that incident beam 31 may be focussed onto IC 100, and the focussed spot size can be on the order of the width of a metal conductor (e.g. 0.8 $\mu$m). Scanning optical microscope 95 can further include an eyepiece or video camera (not shown) for visually inspecting and selecting a particular portion of IC 100 to be analyzed, or as an aid in centering IC 100 on stage 99.

Stage 99 supports IC 100 within scanning optical microscope 95 and further facilitates providing a plurality of electrical connections 94 from digital IC tester 90 to IC 100. Stage 99 generally includes a socket for making these electrical connections, and preferably can be configured to accommodate IC 100 regardless of its packaging. Stage 99 additionally is coupled to digital IC tester 90 by a plurality of electrical connections 94 (e.g. ribbon cables.)

Digital IC tester 90 may be an Integrated Measurement Systems. Inc., *Model ATS FT or Model ATS Blazer*! IC tester, and is preferably coupled to global power supply 80 and one or more dedicated power supplies 70. These power supplies (80, 70) may be the computer-controlled type manufactured by Keithly Instruments (e.g. model 238 source measurement unit.) Dedicated power supply 70 and global power supply 80 are shown sharing a common ground 75 in FIG. 1. However, dedicated power supply 70 and global power supply 80 may be grounded separately for a number of reasons including, to isolate noise from one power supply from leaking into the other.

The global supply line 85 is preferably coupled to the digital IC tester 90. The dedicated supply line 65, which connects dedicated power supply 70 and digital IC tester 90, is preferably coupled to display 45. An amplifier 60 may optionally be used to amplify the voltage on line 65 and to isolate line 65 from any loading effects of display 45. Whether amplifier 60 is present or not, the voltage alteration on supply line 65 is provided to display 45 as analytical output signal 35.

Display 45 includes an image processor 50 and a cathode ray tube (CRT) 40. Analytical output signal 35 is preferably coupled to image processor 50 within display 45 along with position signal 111 from light scanner 110, and photodetector output signal 130 from photodetector 120. The image processor would preferably process these three signals to produce a standard video signal (e.g. NTSC, PAL, etc.) for display on CRT 40, or any other display device accepting a standard video signal (i.e. flat panel display.)

Operation

Initially, IC 100 is placed onto stage 99. A plurality of electrical connections 94 from digital IC tester 90 is made to stage 99 coupling dedicated power supply 70 and global power supply 80 to IC 100. Global power supply 80 preferably supplies a constant voltage, and is coupled to the IC 100 for powering up and setting states within the IC 100. Dedicated power supply 70 may be configured to supply either constant current or constant voltage, and is preferably coupled to a point of interest on IC 100. Digital IC tester 90, or alternately, a computer-controlled switch matrix (not shown) facilitates the application of global power supply 80 and dedicated power supply 70, which may be in the form of input test vectors to the IC 100. Digital IC tester 90 also measures output states from IC 100 in response to the input test vectors. This measurement may occur in a serial or a parallel fashion. For example, if multiple dedicated power supplies are used at multiple points of interest, they may be measured simultaneously (i.e. parallel), or they may be measured successively one after the other (i.e. serially). A set of input test vectors is defined herein as a set of input voltages that are provided to input pins of IC 100 either all at once or in a predetermined sequence in order to produce a desired response from IC 100 in the form of one or more output states as defined by output voltages at output pins of IC 100. In some cases, this may include applying a set of input test vectors to configure the IC 100 into a known failing mode.

An example would be if an input/output pin of IC 100 has a current leakage path. The input/output pins on the IC 100 may be configured (using input test vectors) to a high impedance state while being interrogated with dedicated power supply 70 (configured to constant voltage and varying current.) It should be noted that configuring an input/output pin in a high impedance state implies that little or no current is drawn when a voltage supply is connected to the pin, and the pin appears to have infinite impedance. If the current drawn from dedicated power supply 70 is higher than an expectedly small amount, there is current leakage occurring somewhere. Current leakage while the pin is configured to a high impedance state signals a defect in a path that is connected to this pin, and the leakage current and voltage of the dedicated power supply are measured. Dedicated power supply 70 may then be configured to provide constant current and variable voltage, while scanned according to the procedure described below. Those skilled in the art will understand that the same pins of an IC can provide both inputs and outputs depending upon IC operation.

With IC 100 configured (using global power supply 80 and dedicated power supply 70), in a known state wherein IC 100 fails a functional test (preferably due to a defect), focussed laser beam 31 is preferably applied to reveal root causes of the failing functional test. Stage 99 may be moved in an X-Y direction to further center IC 100 under the scanning lens 105.

IC 100 is then scanned using light scanner 110, which moves the focussed laser beam 31 across IC 100. As the focussed laser beam moves into the neighborhood of a defect on IC 100, the laser induces localized current changes. Suspect areas of IC 100 may then be tested by coupling dedicated power supply 70 to a point of interest while scanned laser beam 31 causes a localized current change in any path coupled to this point of interest, and this current change appears on dedicated supply line 65.

Preferably, dedicated power supply 70 of apparatus 10 is configured such that it provides a predetermined current to the point of interest that it is coupled to, while the voltage at the point of interest is varying. Therefore, when dedicated supply line 65 experiences a current change as described above, a voltage alteration will occur in response to accommodate the increased loading. This alteration in voltage that occurs on dedicated supply line 65 may then be amplified if necessary with an amplifier 60 that is coupled to the image processor 50 via the analytical output signal 35. Therefore, when incident laser beam 31 irradiates a defect on IC 100, a voltage alteration will occur on dedicated supply line 65 and not on global supply line 85.

In display 45, analytical output signal 35 is preferably used in combination with position signal 111 and photodetector signal 130 to form a map of IC 100 being scanned by focussed laser beam 31. Exceeding a predetermined threshold of voltage alteration on dedicated supply line 65 indicates a defective spot on IC 100 and the image processor makes note of this position using position information supplied via position signal 111. The map can then be used for locating defects in IC 100 that cause IC 100 to fail functional tests. Additionally, image processor 50 can provide capabilities for processing and storing the signals 35, 111, and 130 including averaging, contrast enhancing, and digitizing the signals in order to generate the maps or images with enhanced resolution for more precisely locating the defects in IC 100 that are responsible for failing functional tests. It should be noted that adjusting the contrast of the video signal might in some cases prove to be advantageous in the location of defects. Display 45 can be part of scanning optical microscope 95; or it can be in the form of a separate instrument (e.g. a computer).

Preferably global power supply 80 of apparatus 10 supplies a constant voltage to IC 100 powering up the electrical devices contained therein in a static state, concurrently, dedicated power supply 70 is coupled to a point of interest on IC 100. For example, an input output pin of IC 100 may be coupled to dedicated power supply 70 through digital IC tester 90, a plurality of connections 94, and stage 99; or alternatively, dedicated power supply 70 may be coupled directly to a device or conductor of interest on IC 100 with a microprobe. Therefore, if global power supply line 85 is filtered (e.g. with a filter capacitor), dedicated supply line 65 is isolated from this filtering and any voltage alteration induced thereon is not also attenuated with the filtering device. Hence, the voltage alteration signal will be a more pronounced signal, allowing more defects to be detected.

In addition, by coupling dedicated power supply 70 to a point of interest on IC 100 while global power supply 80 powers up IC 100, the amount of noise on the dedicated power supply 70 is reduced. This is because most of the noise is now contained on global power supply 80. Thus, if a moderately defective circuit element on IC 100 that is exposed to light beam 31 does not generate as large of voltage alteration as a completely defective circuit element, it is more likely to be noticed on dedicated power supply 70 than global power supply 80 because it has less noise to overcome to be recognized.

As an aid in locating defects within IC 100 that are responsible for producing functional failures, a reflected-light image or map of IC 100 is preferably produced in the display 45 either separately or superimposed with map of the defects mentioned above. Such a reflected-light image is preferably construed from the position signal 111 and from a detector output signal 130 from a photodetector 120 (e.g. a germanium photodetector), which measures a portion of the return portion of the focussed laser beam 31 that is reflected or scattered from IC 100. This can be accomplished, for example, by placing beam splitter 125 in the path of laser beam 31. The reflected-light image can also be used for precisely focussing laser beam 31 on the circuit elements in IC 100 by observing the sharpness of details in the reflected-light image. This can be done when focussing laser beam 31 for both backside and frontside analysis. In general, the resolution of the reflected-light image will depend upon the spot size of the focussed laser beam 31. Additionally, polishing and/or antireflection coating of the substrate during backside analysis can be advantageous for improving the quality of the reflected-light image when this mode of analysis is selected.

Trends in the IC industry (i.e. flip-chip packaging techniques, multiple metal layer designs, etc.) may make analysis from the frontside (as described above in the notation section) of the die very difficult. Accordingly, the preferred embodiment may be used in either the frontside or backside analysis, wherein incident laser beam 31 (because of the chosen wavelength) may be tuned to achieve the desired effect regardless of which analysis may be desired. When applied to the backside this technique may require thinning and/or polishing of the substrate in order to achieve the desired results.

In frontside and backside analysis, it may be preferable to use differing wavelengths of laser beam 31 in generating the localized currents. Localized current generation may result from electron-hole pairs being induced by laser beam 31 (with a wavelength of around 1 $\mu$m) or alternately by locally heating IC 100 with laser beam 31 (with a wavelength of around 1.3 $\mu$m), to name a few ways. For example, backside analysis may be performed by selecting a photon energy (which is inversely related to wavelength) of laser 30 that is less than the bandgap energy of the substrate (substrates may consist of Silicon, Silicon on Insulator (SOI), Germanium, and other III-V compounds.) In the case of a Silicon substrate, the bandgap energy can correspond to a lasing wavelength that is in the range of 1.2 to 2.5 $\mu$m, and preferably about 1.3 $\mu$m. Such a wavelength for laser 30 provides for local heating without generating electron-hole pairs (which may distort the analysis by producing spurious signals, and/or may distort the analysis by perturbing device operation.)

In general, any laser operating in the wavelength range of 1–2.5 $\mu$m, which emits sufficient laser power (e.g. 50–500 mW or more) may be used in the preferred embodiment of the present invention. Also, a laser may be selected that emits a plurality of wavelengths including undesirable wavelengths, and may additionally be filtered using filter 35 in the path of the light beam, or alternatively by selecting internal cavity mirrors that restrict operation to desired wavelengths. As mentioned above, ICs may be constructed onto various types of substrates that have different bandgap energy values. Accordingly, those skilled in the art will know depending on the type of substrate, type of analysis (frontside or backside), and/or method of generating local currents (i.e. electron hole-pair, thermal, etc.), which combination of laser wavelengths, laser types (semiconductor diode, solid-state, or gas), and/or filter configurations are desired for their particular analysis with the present technique or invention.

Light scanner 110 includes a pair of galvanometers that each support and control movement of a plane mirror (not shown), with the mirrors being in an x-y arrangement so that the laser beam 31 can be scanned in two dimensions. In other embodiments of the present invention, an acousto-optical modulator or an electro-optical modulator may be substituted for the galvanometer-driven mirrors to form the light scanner 110. Light scanner 110 is preferably controlled to step or raster scan the focussed laser beam 31 over a predetermined portion of IC 100, or over IC 100 in its entirety. Light scanner 110 further provides an output position signal 111 that can be used to determine the position of the focussed laser beam 31 on IC 100 at any instant in time. The position signal 111 can be derived, for example, from a voltage waveform used to drive the galvanometers. When the scan is stepped, the portion of IC 100 being scanned can be divided into a predetermined number of pixels, with light scanner 110 directing the focussed laser beam 31 from pixel to pixel, dwelling at each pixel for a predetermined time period to allow data to be accumulated and the signal to be averaged by image processor 50. Such signal averaging is preferably used to form an enhanced-resolution map for more precisely locating defects within IC 100 that produce the functional failures of IC 100. Additionally the operating temperature of IC 100 may be controlled by controlling the temperature of stage 99 (e.g. using a thermoelectric cooling/heating module). This may be advantageous in the case of thermally generating localized defect currents in that the amount of static background current may be reduced by reducing the temperature giving the current change (or voltage alteration) a more profound effect.

Figure 2:
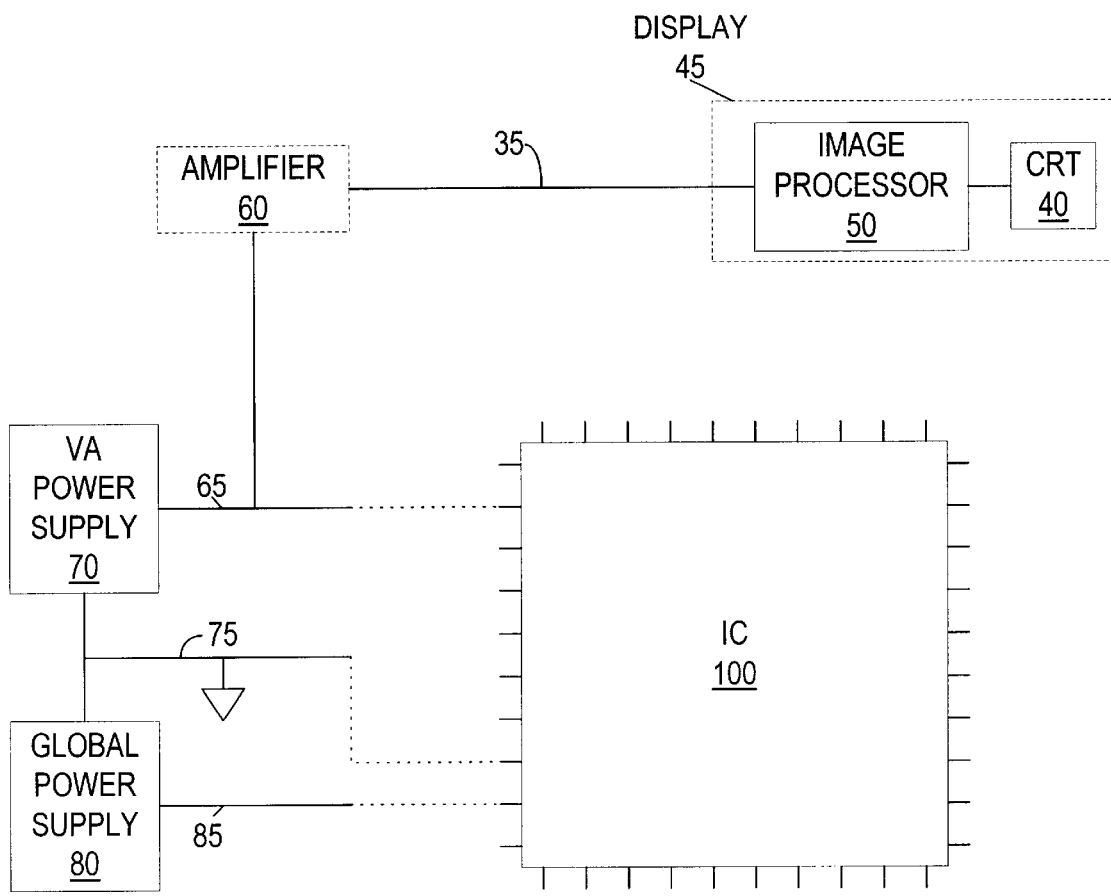
FIG. 2 is a schematic diagram of an IC being used in the apparatus of FIG. 1.

In addition, the complexity of IC 100 may be such that digital IC tester 90 may not be desired. Generally if IC 100 is less complex and contains fewer circuit elements (i.e. transistors, resistors, capacitors, etc.) it may not be desirable to utilize digital IC tester 90 to couple signals into IC 100. Referring now to FIG. 2, dedicated supply line 65, global power supply line 85 and common ground line 75 are all coupled to IC 100 for the analysis mentioned above. Although the above discussion disclosed using digital IC tester 90, in some cases it may not be desired and IC 100 may still be tested by coupling dedicated power supply 70 to a point of interest (e.g. direct wired to a pin or microprobed to a specific point) while global power supply 80 is also coupled directly to IC 100. For example, an IC may contain very few circuit elements (e.g. a linear or analog IC) when compared to a high-speed microprocessor containing millions of transistors, yet still the defect causing the IC to fail may elude the engineer trying to find its root cause. In this case using digital IC tester 90 may be too excessive for an IC of this nature and therefore directly wiring global power supply 80 and dedicated power supply 70 to IC 100 is desirable.

In another embodiment of the present invention, multiple dedicated power supplies in addition to global power supply 80 and dedicated power supply 70 are preferably coupled to separate points of interest on IC 100. This would allow the user to interrogate multiple paths and/or pins on IC 100 in any desired order (e.g. serially, parallel, or some random variation.)

In another embodiment of the present invention, stage 99 may be used to bring IC 100 to the edge of failure while scanning with laser beam 31 to further drive IC 100 into a failing mode.

In yet another embodiment of the present invention, the voltage of global power supply 80 is preferably reduced in a range from normal operating voltage (e.g. 1.3–5V) to zero. dedicated power supply 70 therefore may be coupled to a point of interest while laser beam 31 is scanned over IC 100.

An example illustrating operation of the apparatus and method of the present invention for locating a defect, which was producing functional test failures in IC 100 is provided hereinafter.

Figure 3:
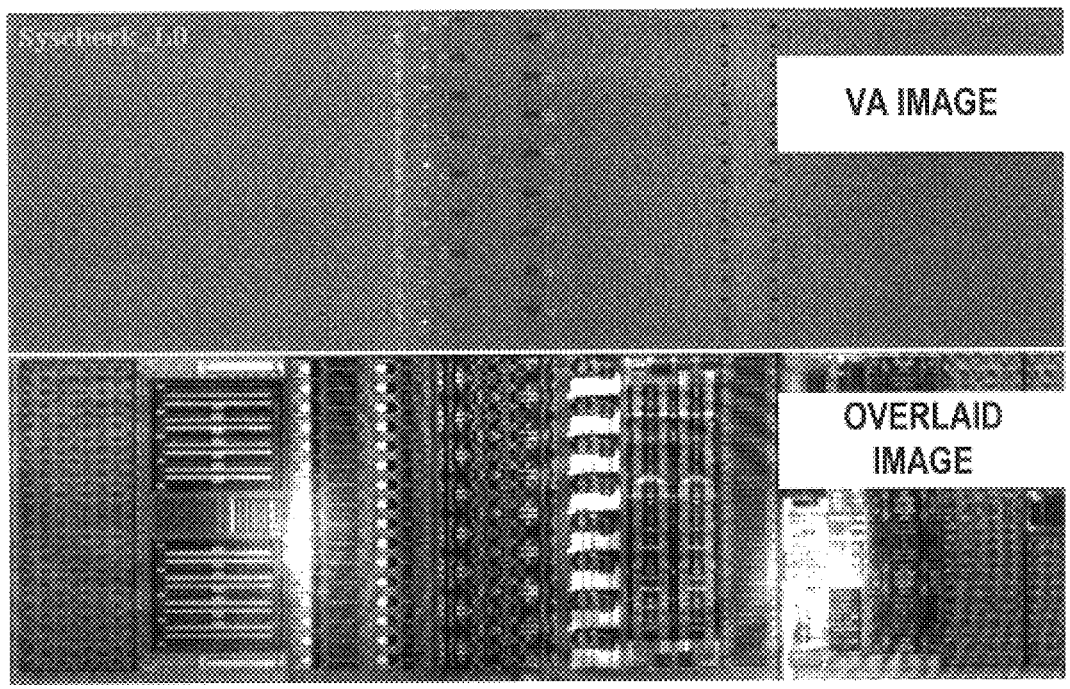
FIG. 3 is an image of a functional IC used as a control for an experiment and was obtained using the apparatus of FIG. 1, with a voltage alteration ("VA") image of the scanned area, and an overlaid image of the same scanned area.

FIG. 3 shows a control image (i.e. map) obtained using apparatus 10 of the preferred embodiment to perform a backside analysis by thermally inducing the current with laser 30 (with a wavelength of approximately 1.3 $\mu$m) on a microprocessor 100. FIG. 3 has two parts, (1) a VA image and (2) an overlaid image, either of which may appear on display 45. The VA image represents a mapping of the area of interest with any voltage alterations in it. The overlaid image represents a picture of the microprocessor using the reflected light off microprocessor 100 superimposed with the VA image.

Figure 4:
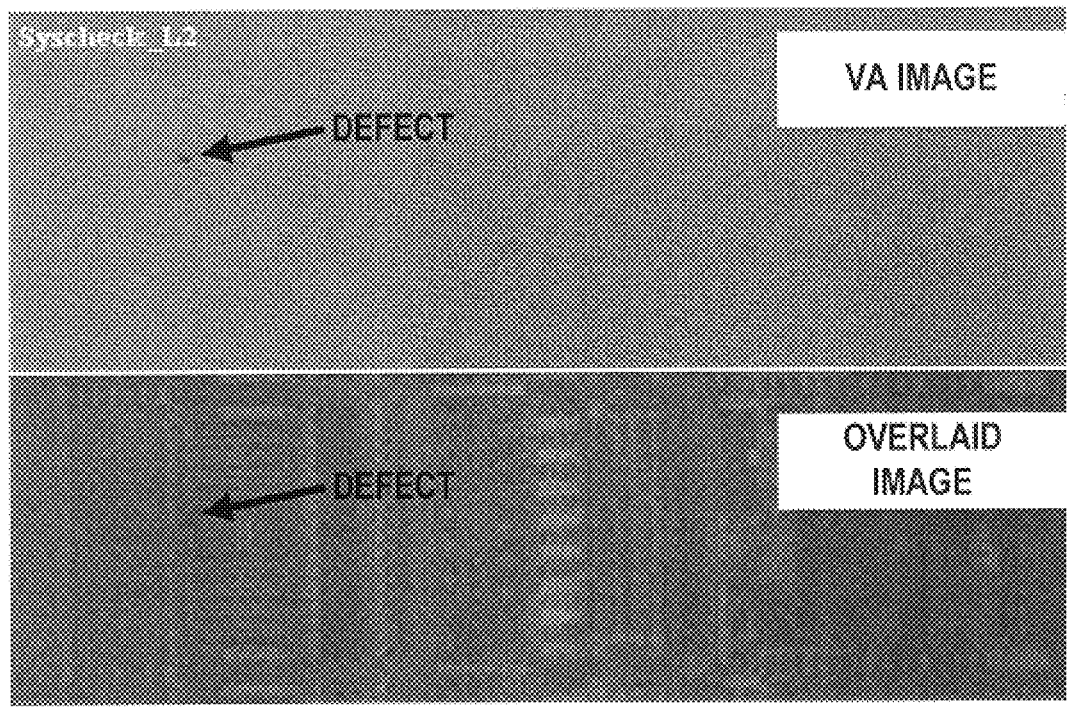
FIG. 4 shows VA and overlaid images of a failing IC.
Figure 5:
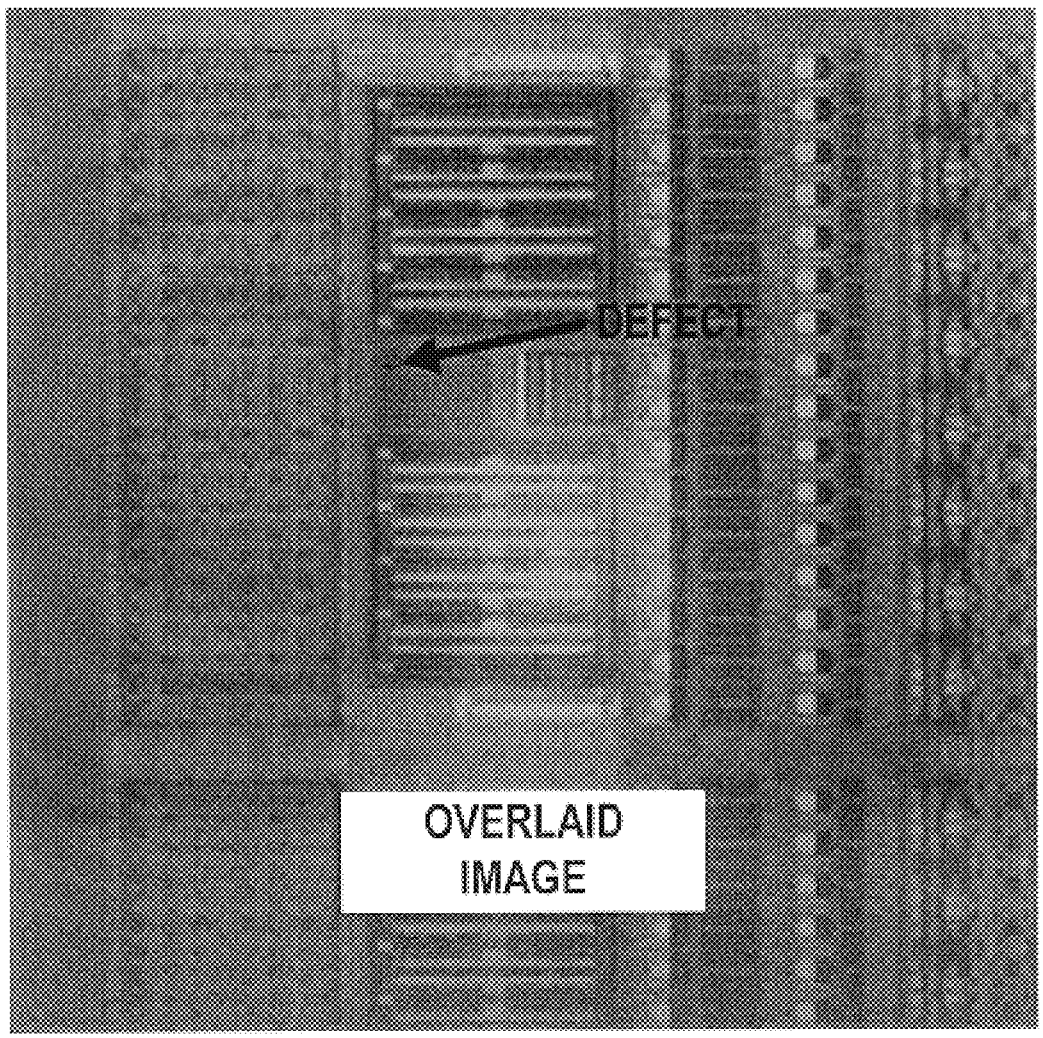
FIG. 5 is the overlaid image of FIG. 4 under a higher magnification.

FIG. 4 shows an experimental image (i.e. map) similar to that shown in FIG. 3 (the same part type is used), except for that initial testing revealed a current leakage path from a point of interest to the power supply. Constant current was applied to the point of interest using a microprobe, while microprocessor 100 was scanned with a laser (with a wavelength of approximately 1.3 $\mu$m). A defect appears on the VA image as shown in FIG. 4. Microprocessor 100 was de-processed and a cross section of it was taken with a focussed ion beam (FIB), which proved that the inner layer dielectric was voided in this region causing a metal 1 to metal 1 short. FIG. 4 also contains the overlaid image that consists of a VA image superimposed with light reflected from microprocessor 100. Referring now to FIG. 5, the overlaid image of FIG. 4 is shown at a higher magnification.

It should be noted that the VA image of FIG. 3 (control) may appear to contain defects (dark spots), while the VA image of FIG. 4 (experiment) does not. However, these dark spots are not defects, they are normal paths for current dissipation. The reason the dark spots do not appear in the FIG. 4 VA image is that a majority of the current flows to the defect, and not the normal current paths.

Numerous variations and modifications will become apparent to those skilled in the art once the above disclosure is fully appreciated. It is intended that the present invention be interpreted to embrace all such variations and modifications.

What is claimed is:

1. A method of locating an integrated circuit defect comprising:

configuring a integrated circuit in a failure mode using a first power supply that provides a constant voltage;

applying one or more additional power supplies that provide constant currents which are coupled to one or more particular points of interest on the integrated circuit, wherein the constant currents are set to a predetermined value and the voltage varies;

scanning the integrated circuit with a focussed light source, thereby inducing current changes in a path connected to one of the particular points of interest, wherein the current changes cause a change in voltage of at least one of the additional power supplies; and measuring at least one of the additional power supplies' change in voltage while tracking a spot position using a position signal from the focussed light source and noting such position as a defect.

2. The method of claim 1 further comprising collecting reflected light from the scanned light source using a photodetector.

3. The method of claim 2 wherein an image is constructed using a photodetector output signal from the photodetector and the position signal from the scanned light source and the position information of the defects.

4. The method according to claim 1 wherein the first power supply and the additional power supplies are coupled to the integrated circuit via a digital integrated circuit tester or a computer-controlled switch matrix.

5. The method according to claim 1 wherein the additional power supplies are coupled to the integrated circuit by a direct attachment with a microprobe.

6. The method according to claim 1 wherein the measurement of the additional power supplies occurs in a parallel fashion.

7. The method according to claim 1 wherein the measurement of the additional power supplies occurs in a serial fashion.

8. The method according to claim 1 wherein the integrated circuit comprises current leakage paths coupled to an input/output pin.

9. The method of claim 1 wherein configuring the integrated circuit in the failure mode comprises using a temperature controlled stage for holding the integrated circuit and maintaining the integrated circuit at a desired temperature.

10. The method of claim 9 wherein the integrated circuit is set to a temperature corresponding to the edge of failure, and the light source further induces failure.

11. The method of claim 1 wherein the substrate of the integrated circuit comprises silicon.

12. The method of claim 1 wherein the light source is a laser.

13. The method of claim 12 wherein the photon energy of the laser is sufficient to induce a photocurrent in the integrated circuit.

14. The method of claim 12 wherein the wavelength of the laser is in the range of about 1 $\mu$m to about 2.5 $\mu$m.

15. The method of claim 12 wherein the photon energy of the laser is insufficient to induce a photocurrent in the integrated circuit, and wherein the laser induces a current in the integrated circuit thermally.

16. The method of claim 15 wherein the wavelength of the laser is in the range of about 1 $\mu$m to about 2.5 $\mu$m.

17. The method of claim 1 wherein the scanning of the focused light source across the integrated circuit is performed by a scanning optical microscope.

18. The method of claim 1 wherein the voltage of the first supply is in the range of 0 volts to 5 volts.

* * * * *